United States Patent [19]
Sloan, Jr.

[11] 3,938,176
[45] Feb. 10, 1976

[54] PROCESS FOR FABRICATING DIELECTRICALLY ISOLATED SEMICONDUCTOR COMPONENTS OF AN INTEGRATED CIRCUIT

[75] Inventor: Benjamin Johnston Sloan, Jr., Richardson, Tex.

[73] Assignee: Texas Instruments Incorporated, Dallas, Tex.

[22] Filed: Sept. 24, 1973

[21] Appl. No.: 400,492

[52] U.S. Cl. .................... 357/49; 357/45; 148/175
[51] Int. Cl.² .......................................... H01L 27/12
[58] Field of Search ............ 317/235 F; 357/40, 45, 357/48, 49

[56] References Cited
UNITED STATES PATENTS

| | | |
|---|---|---|
| 3,509,433 | 4/1970 | Schroeder ........................... 317/234 |
| 3,666,548 | 5/1972 | Brack et al. ......................... 117/212 |
| 3,738,877 | 6/1973 | Davidsohn .......................... 148/175 |
| 3,748,546 | 7/1973 | Allison ................................ 357/45 |

Primary Examiner—Andrew J. James
Assistant Examiner—Joseph E. Clawson, Jr.
Attorney, Agent, or Firm—Harold Levine; James T. Comfort; Gary C. Honeycutt

[57] ABSTRACT

Disclosed is a method of fabricating dielectrically isolated semiconductor components of an integrated circuit, and the semiconductor component formed by this method, each component having a plurality of high conductivity regions extending from the interior of said component to the surface thereof to provide high conductivity paths to selected semiconductor regions of the component.

6 Claims, 5 Drawing Figures

PROCESS FOR FABRICATING DIELECTRICALLY ISOLATED SEMICONDUCTOR COMPONENTS OF AN INTEGRATED CIRCUIT

BACKGROUND OF THE INVENTION

1. Field of the Invention

This invention relates to semiconductor components in general and specifically to semiconductor components of an integrated circuit that are dielectrically isolated from each other.

2. Description of the Prior Art

In the conventional method of fabricating power transistors, silicon controlled rectifiers, and other high power components of an integrated circuit, a plurality of semiconductor regions are ohmically connected in parallel with metal interconnections such that common semiconductor regions are interdigitatedly connected or are connected alternately in some geometrical fashion in order to handle the high power requirement of such components. These interdigitated regions, making up a semiconductor device or semiconductor component in dielectrically isolated material, are normally isolated from other semiconductor components in the same substrate by a layer of dielectric insulation that surrounds each component in the substrate and intersects a surface of the substrate.

In one method of reducing the collector resistance of a power transistor, for example, a highly doped, high-conductivity collector contact region of the same conductivity type as the collector is normally formed inside of the surrounding insulating layer and adjacent thereto. The highly doped collector contact region also intersects the same surface of the substrate where ohmic contact can be made directly to the high conductivity region or into another highly doped, high-conductivity region of the same conductivity type which has been diffused into the surface of the substrate at the intersection of collector contact region and surface. Since the collector contact region only surfaces at the periphery of the component, due to its inherent structure, there is a limit as to the degree of reduction of collector resistance.

Accordingly, an object of this invention is to provide a method of fabricating dielectrically isolated semiconductor components of an integrated circuit having high conductivity paths to selected semiconductor regions.

Another object of this invention is to provide a method of fabricating dielectrically isolated transistor components of an integrated circuit, each transistor having a plurality of ohmic contacts to collector contact regions at selected locations.

A further object of this invention is to provide a dielectrically isolated semiconductor component of an integrated circuit having high conductivity paths to selected semiconductor regions.

Yet another object of this invention is to provide a dielectrically isolated transistor component of an integrated circuit having a plurality of ohmic contacts to the collector contact region at selected locations.

SUMMARY OF THE INVENTION

In applicants' invention, a semiconductor component of an integrated circuit is fabricated by first forming a plurality of contact grooves of substantially the same depth in a monocrystalline semiconductor body of one conductivity type from one surface thereby, which are completely surrounded by an isolation groove of greater depth. A highly doped, high conductivity region of the same conductivity type as the body is formed adjacent the surfaces of the contact grooves, the isolation groove and the remaining portion of the one surface of the body.

A layer of dielectric insulation is formed on the surface of the high conductivity region, followed by the formation of a relatively thick layer of polycrystalline silicon or other material on the layer of insulation to serve as a "handle" for subsequent process steps.

Semiconductor material from the opposite surface of the semiconductor body is removed to a level such that the insulating layer covering the isolation groove, which is now filled with material, is exposed but such a level does not expose any of the insulating layer covering the contact grooves, which are also now filled, but rather either exposes the high conductivity region over the contact grooves or closely approaches the high conductivity region, thereby producing a substrate having a dielectrically isolated monocrystalline semiconductor pocket with a plurality of high conductivity regions close to the surface which in turn furnish high conductivity electrical paths to a plurality of desired semiconductor regions.

A plurality of other semiconductor regions are then formed in desired locations to finish forming the semiconductor components. Of course, many components are fabricated in the substrate at the same time and they subsequently interconnect to form an integrated circuit. Ohmic contacts to electrically connect similar regions of each component and to electrically connect desired components are formed by patterned metal contacts and insulating layers on the new exposed surface of the substrate.

BRIEF DESCRIPTION OF THE DRAWING

The novel features believed characteristic of this invention are set forth in the appended claims. The invention, itself, however, as well as other objects and advantages thereof, may best be understood by reference to the following detailed description of one illustrative embodiment, when read in conjunction with the accompanying drawing, wherein:

DESCRIPTION OF THE PREFERRED EMBODIMENT

Figure 1:
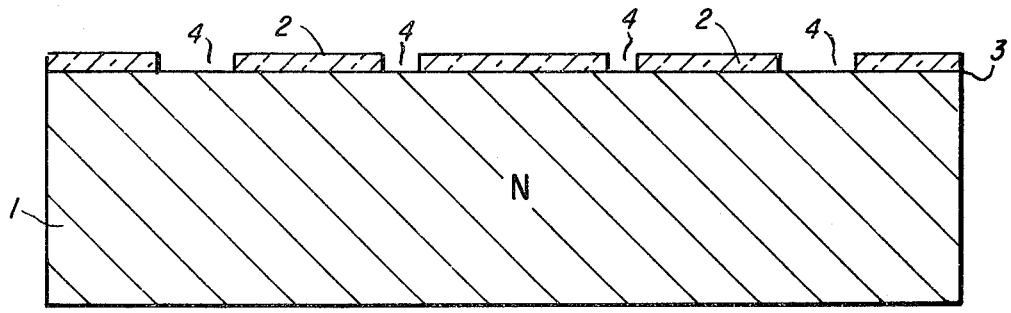
FIGS. 1–4 are cross-sectional views of a portion of an integrated circuit illustrating various stages during the fabrication of a dielectrially isolated semiconductor component.

Referring now to the drawing, it should be noted that different structural elements shown in the different figures are not drawn to scale for illustrative purposes. Also, for simplicity's sake, only the fabrication stages of one component of an integrated circuit are shown in the drawing, although other semiconductor components of similar or dissimilar types (not shown) are fabricated during the same process stages.

A semiconductor body 1 of monocrystalline semiconductor material of one conductivity type, such as N type silicon, for example, is shown in FIG. 1, after the formation of an etch mask 2 on the surface 3 of the body 1. The silicon body 1 has a crystal orientation of (100), i.e., the major surfaces of the body are substantially coplanar with the (100) crystallographic plane. Body 1 is typically a slice or wafer of silicon about two and one-half inches in diameter and about 20 mils in thickness, for example, with a highly polished surface 3. The body 1 is shown being of N type conductivity, having been doped with a Group III element, such as arsenic, to a relatively high resistivity of 20 ohm-cm., for example. Although N type silicon is described for illustrative purposes only as the body 1, different conductivity types and different semiconductor materials can be used within the purview of the invention.

The etch mask 2, of conventional etch resistant material, such as silicon oxide or silicon nitride, for examples, is formed by conventional deposition techniques or the silicon oxide can be thermally grown, while the apertures 4 and 4' are formed in the etch mask 2 by conventional photolithographic and etch techniques. The width of the aperture 4 is wider than the width of the apertures 4', which difference in width will affect the difference in depth of the isolation groove 5 and the contact grooves 5', as will subsequently be discussed. The aperture 4, although appearing in FIG. 1 to be separate and distinct apertures, in reality, is a single substantially circular aperture (see FIG. 5), while apertures 4' are individual and separate apertures. Although only two apertures 4' are shown for simplicity's sake, the number of such apertures 4' is not limited by the invention. The relative widths of the apertures 4 and 4' are very important because the depths of the grooves 5 and 5' to be formed by etching the body 1 through the apertures 4 and 4' are controlled by the width of the apertures 4 and 4'. The body 1, with its etch mask 2, is subjected to an orientation dependent etch for a sufficient length of time to form the isolation groove 5 and the contact grooves 5'.

It is well known in the semiconductor art that an etch solution comprising potassium hydroxide, propynol and water removes silicon at a well controlled rate in the range of from 0.5 to 1.5 microns per minute, depending on the temperature and rate of agitation in the direction normal to the (100) plane. This solution does not appreciably attack the silicon in a direction normal to the (111) plane. The resulting etched area has flat, well defined, sloping sides forming an angle of approximately 54.7° with the (111) plane. The etched groove will bottom-out into a "V" shape at which time the etch rate drops to essentially 0. The depth of the groove depends on the width of the aperture provided in the etch mask 2 on the surface 3, and only slightly upon the etch time, if bottoming is allowed to completion. Therefore, by controlling the relative widths of the apertures 4 and 4', then the relative depths of the grooves 5 and 5' can also be completely controlled. Because the width of apertures 4 is wider than the width of apertures 4', isolation groove 5 is deeper than the contact grooves 5'. Gallium Arsenide (Ga As) also can be orientation dependently etched from the (100) surface to form similar grooves as was described in relationship to silicon.

Figure 2:
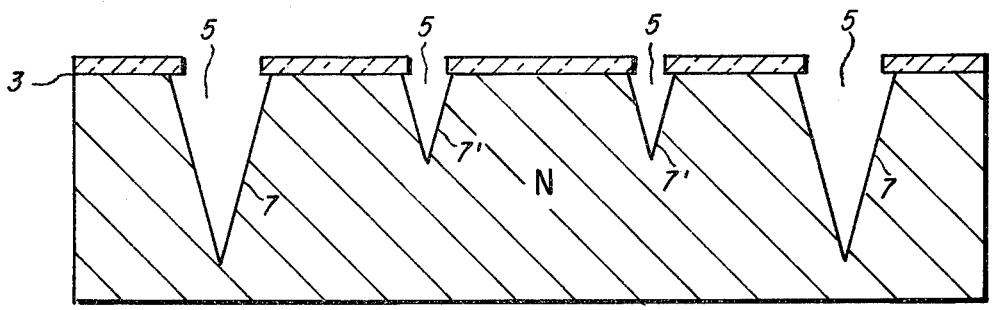
Figure 3:
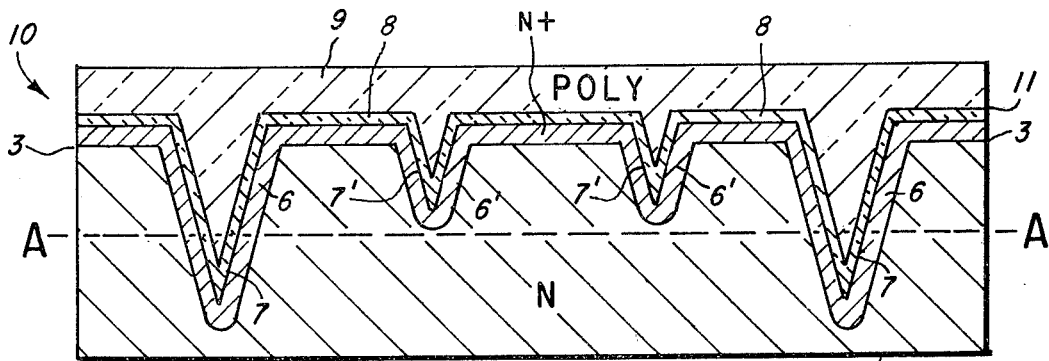

After the grooves 5 and 5' have been etched to the desired depths, the etch mask 2 is removed by conventional methods and the high conductivity (low resistivity) collector contact region 6 of the same conductivity type as body 1, N+, is formed either by conventional diffusion or ion implantation methods of introducing doping impurities into the body 1 by the surfaces 7 and 7' of the grooves 5 and 5', respectively, and the remaining surface 3, as illustrated in FIGS. 2 and 3. Another but less desirable method of forming the collector contact region is to epitaxially deposit a layer of monocrystalline N+ type silicon on the surfaces 7 and 7' of the grooves and surface 3 by conventional epitaxial methods.

Following the formation of the collector contact region 6, an insulating layer 8 is formed on the surfaces 7, 7' and 3, of the collector contact region 6. Such an insulating layer 8 can be formed by depositing a dielectrically insulating material, such as silicon oxide or silicon nitride, on the collector contact region by conventional deposition methods.

In order to facilitate the handling of the substrate, comprising different materials, generally indicated by the numeral 10, a layer or "handle" 9 of material, such as polycrystalline silicon, for example, which by nature, has a high resistivity, is formed on the surface 11 of the insulating layer 8 by conventional deposition methods. Although, for illustrative purposes, layer 9 is described as being formed of polycrystalline silicon, since such a material is relatively easy to deposit, many materials can be used.

Figure 4:
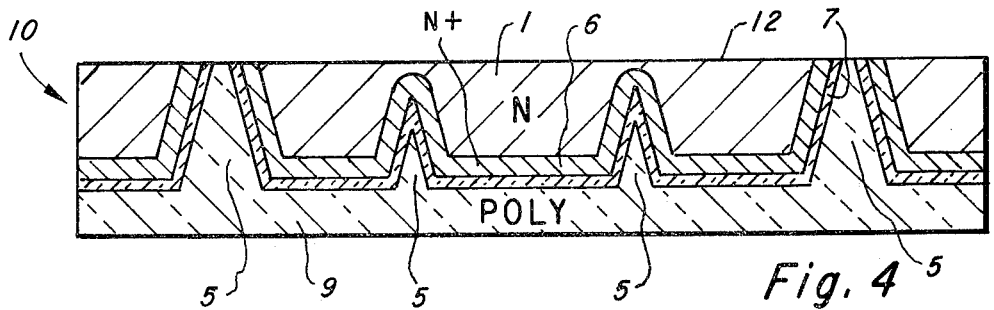

The substrate 10 is shown inverted in FIG. 4, with a portion of the semiconductor body 1 removed down to the now exposed surface 12, to the level shown by the dotted lines marked "A" in FIG. 3. The surface 12 of body 1 is exposed by uniformly removing the body 1 by etching for example, from the opposite surface 13 to the desired level or surface 12. Mechanical polishing can also be used followed by a chemical polish to remove a portion of the body 1, if so desired, to expose the new surface 12.

The amount of body 1 that is removed is determined by the desired level or surface 12 which exposes the portion of the insulating layer 8 covering the material-filled isolation groove 5, which material-filled isolation groove 5 will subsequently be called isolation peak 5. The isolation peak 5 intersects the surface 12 in a completed circle, although the shape of the intersection of the insulating layer 8 at the surface 12 is not pertinent to the invention, just as long as the insulation layer 8 completely surrounds the body 1. However, the removal of a portion of the body 1 is halted before exposing the insulating layer 8 covering the material-filled contact grooves 5', which material-filled contact grooves 5' will subsequently be called, contact mesas 5'.

Figure 5:
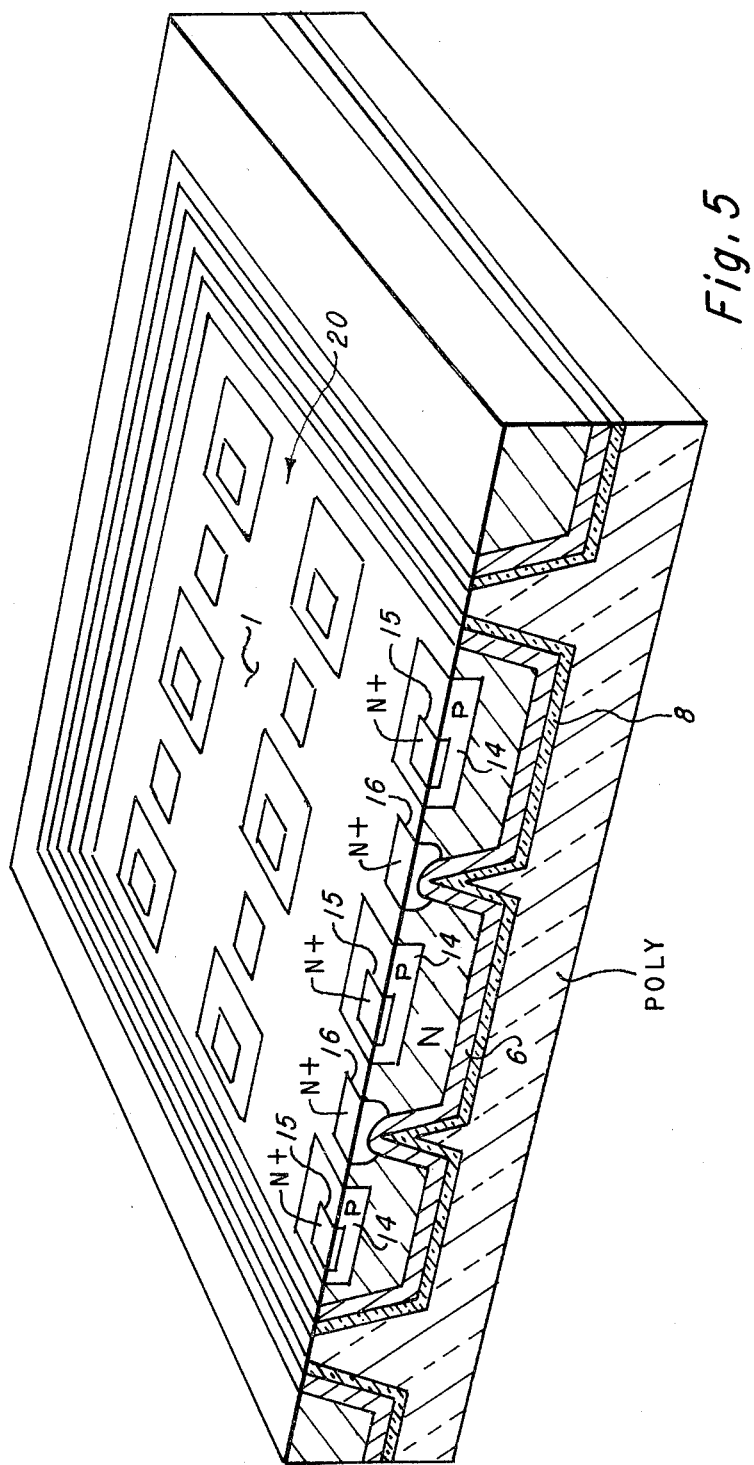
FIG. 5 is a perspective view of a portion of an integrated circuit illustrating a dielectrically isolated semiconductor component after the formation of semiconductor regions, but prior to the application of metal contacts.

Although as shown in FIGS. 4 and 5, the surface 12 does not expose the collector contact region 6 over the contact mesas 5', the collector contact region 6 covering the contact mesas 5' could be exposed without damaging the subsequently formed component. Due to the variants of manufacturing, in reality, some mesas 5' would probably be exposed while others would not but would be in close proximity to the surface 12 in order to bring the collector contact region 6 as close to the surface 12 as possible at selected locations.

The insulating layer 8 completely surrounds the body 1 which now is in essence a pocket of monocrystalline silicon dielectrically isolated from other pockets (not shown) in the substrate 10.

After the surface 12 has been attained, a plurality of base regions 14 are formed in the body 1 of a conductivity type opposite from the conductivity type of the body 1, which forms the collector of the semiconductor component generally indicated by the numeral 20 in FIG. 5. Since in the example given, the body 1 is of N type silicon, then the base regions 14 will be P type. The base regions 14 are formed by conventional methods, such as diffusion or ion implantation, coupled with the use of conventional masking techniques for masking the surface 12 and exposing the surface 12 to the doping impurities only where such base regions 14 are desired to be formed.

As shown in FIG. 5, the emitter regions 15 and the surface collector contact regions 16 are formed by the same methods which were used to form base regions 14. Impurities of the same conductivity type as the collector or body 1 are introduced into the base regions to form high conductivity N+ type emitter regions 15 and are introduced into the body 1 over the collector contact mesas 5' to form the high conductivity N+ surface contact regions 16. The surface contact regions 16 are formed deep enough to connect the N+ collector regions over the contact mesas 5' with the surface where ohmic contact can be made thereby. The collector contact mesas 5' at desired locations furnish high conductivity paths to the collector region, thereby minimizing collector contact resistance.

The final step is to form patterned metal contacts (not shown) on the substrate 10 by conventional metal/insulation methods which contacts make ohmic contact to the desired regions of the semiconductor component 20, thereby ohmically connecting the various regions. For example, the emitter regions 15, the base regions 14 and the surface collector contact regions 16 are each connected in parallel and then the semiconductor component 20 is interconnected with other semiconductor components (not shown) in the substrate 10 to form an integrated circuit.

Observing FIG. 5, it should be obvious that the insulating layer 8 completely surrounds the semiconductor component 20 and dielectrically isolates it from the rest of the substrate 10 and that the surface collector contact regions 15 can be located almost where desired and not at just the periphery of the body 1 enclosed by the insulating layer 8 as in the previously used techniques, thereby decreasing the collector contact resistance as compared to the periphery contacts only.

Although for illustrative purposes only, the semiconductor component 20 was described as a transistor, the invention is not limited to the fabrication of transistors in an integrated circuit but can be used for any semiconductor component that requires that ohmic contact be made by high conductivity paths to large volume semiconductor regions, such as the collector region just described.

Although the preferred embodiment of the invention has been described in rather specific detail, it is to be understood that various changes, substitutions, and alterations can be made therein without departing from the spirit and the scope of the invention as defined by the appended claims.

What is claimed is:

1. A dielectrically isolated semiconductor component of an integrated circuit in a substrate, comprising:
   a. a dielectrically isolated pocket of monocrystalline semiconductor material of one conductivity type in said substrate, said isolation being furnished by a layer of insulating material between said pocket and the remainder of said substrate, said insulating layer having selected spaced ridges in close proximity to one surface of said pocket;
   b. a region of said one conductivity type but of greater conductivity in said pocket and adjacent said insulating layer;
   c. a plurality of rows of semiconductor regions of the opposite conductivity type in said pocket; and, d. a plurality of rows of high conductivity regions of said one conductivity type in said pocket, alternating with said rows of semiconductor regions, said high conductivity regions extending from the surface of said pocket in contact with said region of high conductivity, along said ridges.

2. A semiconductor component as described in claim 1, wherein said pocket is silicon.

3. The semiconductor component as described in claim 1, wherein said insulating layer is silicon oxide.

4. The semiconductor component as described in claim 1, wherein said insulating layer is silicon nitride.

5. The semiconductor component as described in claim 1, wherein said material is polycrystalline silicon.

6. An integrated circuit of dielectrically isolated semiconductor components in a substrate, comprising:
   a. dielectrically isolated pockets of monocrystalline semiconductor material of one conductivity type in said substrate, said isolation being furnished by a layer of insulating material between said pockets and the remainder of said substrate, said insulating layer having selected spaced ridges in close proximity to one surface of each of said pockets;
   b. a region of said one conductivity type but of higher conductivity in each of said pockets and adjacent said insulating layer;
   c. a plurality of rows of semiconductor regions of the opposite conductivity type in each of said pockets; and,
   d. a plurality of rows of high conductivity regions of said one conductivity type in each of said pockets, alternating with said rows of semiconductor regions, said high conductivity regions extending from the surface of said pockets in contact with said region of high conductivity in each of said pockets, along said ridges.

* * * * *